(12) United States Patent
Kim et al.

(10) Patent No.: US 10,084,131 B2
(45) Date of Patent: Sep. 25, 2018

(54) METHOD FOR FABRICATING ELECTRONIC DEVICE WITH VARIABLE RESISTANCE MATERIAL LAYER

(71) Applicant: SK hynix Inc., Icheon-Si (KR)

(72) Inventors: Sang-Soo Kim, Icheon-si (KR); Jung-Nam Kim, Icheon-Si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/369,814

(22) Filed: Dec. 5, 2016

(65) Prior Publication Data

US 2017/0084836 A1  Mar. 23, 2017

Related U.S. Application Data

(62) Division of application No. 14/860,531, filed on Sep. 21, 2015, now Pat. No. 9,515,260.

(30) Foreign Application Priority Data

Apr. 15, 2015  (KR) .......................... 10-2015-0053122

(51) Int. Cl.
| | |
|---|---|
| *H01L 45/00* | (2006.01) |
| *H01L 43/12* | (2006.01) |
| *H01L 43/02* | (2006.01) |
| *H01L 43/08* | (2006.01) |
| *H01L 43/10* | (2006.01) |

(52) U.S. Cl.
CPC .......... *H01L 45/1675* (2013.01); *H01L 43/02* (2013.01); *H01L 43/08* (2013.01); *H01L 43/10* (2013.01); *H01L 43/12* (2013.01); *H01L 45/06* (2013.01); *H01L 45/08* (2013.01); *H01L 45/124* (2013.01); *H01L 45/1233* (2013.01); *H01L 45/1253* (2013.01); *H01L 45/145* (2013.01); *H01L 45/146* (2013.01); *H01L 45/165* (2013.01); *H01L 45/1608* (2013.01); *H01L 45/1641* (2013.01); *H01L 45/1683* (2013.01);

(Continued)

(58) Field of Classification Search
CPC ......................... H01L 45/124; H01L 45/1233
See application file for complete search history.

(56) References Cited

U.S. PATENT DOCUMENTS

| 7,589,344 B2 | 9/2009 | Sato |
|---|---|---|
| 7,786,461 B2 | 8/2010 | Lung |

(Continued)

FOREIGN PATENT DOCUMENTS

KR  10-2009-0099406 A  9/2009

*Primary Examiner* — Stephen Bradley
(74) *Attorney, Agent, or Firm* — Perkins Coie LLP

(57) ABSTRACT

A method for fabricating an electronic device including a semiconductor memory may include: forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell.

24 Claims, 12 Drawing Sheets

(52) U.S. Cl.
CPC ...... *H01L 45/1691* (2013.01); *H01L 45/1658* (2013.01)

(56) References Cited

U.S. PATENT DOCUMENTS

| | | | | |
|---|---|---|---|---|
| 2006/0011902 A1* | 1/2006 | Song | ................ | H01L 45/06 257/4 |
| 2010/0314602 A1* | 12/2010 | Takano | ............... | G11C 11/5685 257/4 |
| 2011/0248235 A1 | 10/2011 | Jeong et al. | | |
| 2012/0068136 A1 | 3/2012 | Park et al. | | |
| 2012/0243296 A1* | 9/2012 | Watanabe | ............... | G11C 11/16 365/148 |
| 2014/0070158 A1* | 3/2014 | Nodin | .................... | H01L 45/06 257/3 |
| 2014/0264234 A1* | 9/2014 | Tu | ......................... | H01L 45/146 257/4 |

* cited by examiner

METHOD FOR FABRICATING ELECTRONIC DEVICE WITH VARIABLE RESISTANCE MATERIAL LAYER

CROSS-REFERENCE TO RELATED APPLICATIONS

This patent document is a divisional of U.S. patent application Ser. No. 14/860,531, published as US 2016/0308127, entitled "METHOD FOR FABRICATING ELECTRONIC DEVICE WITH VARIABLE RESISTANCE MATERIAL LAYER," and filed on Sep. 21, 2015, which further claims priority and benefits of Korean Patent Application No. 10-2015-0053122, entitled "METHOD FOR FABRICATING ELECTRONIC DEVICE" and filed on Apr. 15, 2015. The contents of the before-mentioned patent applications (including US 2016/0308127) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of a method for fabricating an electronic device including a semiconductor memory device, which has a simple process and can improve the characteristic of a variable resistance element.

In an implementation, a method for fabricating an electronic device including a semiconductor memory may include: forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell.

Implementations of the above method may include one or more of the following.

The variable resistance material layer has a horizontal part and a vertical part, and the etching of the first interlayer dielectric layer includes etching the first interlayer dielectric layer to a level corresponding to the surface of the horizontal part of the variable resistance material layer. The removing of the part of the variable resistance material layer includes performing a dry etching process or wet cleaning process. The dry etching process comprises an IBE (Ion Beam Etching) process. The IBE process is performed at a tilt of 30° to 90°. The variable resistance material layer comprises a transition metal oxide, a metal oxide including a perovskite-based material, a phase-change material including a chalcogenide-based material, a ferrodielectric material, or a ferromagnetic material. The method may further comprising, after the removing of the part of the variable resistance material layer: forming a spacer layer along the entire structure including the top electrode; forming a second interlayer dielectric layer over the spacer layer; etching the second interlayer dielectric layer to expose the top electrode; and forming a conductive line over the top electrode to be in contact with the top electrode.

In an implementation, a method for fabricating an electronic device including a semiconductor memory may include: forming a first interlayer dielectric layer and a bottom electrode over a substrate, the first interlayer dielectric layer including an opening to expose the bottom electrode; forming a variable resistance material layer along sidewalls of the opening and the exposed bottom electrode; forming a top electrode over the variable resistance material layer so as to fill the opening; etching the first interlayer dielectric layer to a predetermined depth; and deactivating a part of the variable resistance material layer which surrounding the sidewalls of the top electrode to form a unit cell.

Implementations of the above method may include one or more of the following.

The variable resistance material layer has a horizontal part and a vertical part, and the etching of the first interlayer dielectric layer includes etching the first interlayer dielectric layer to a level corresponding to the surface of the horizontal part of the variable resistance material layer. The deactivating of the part of the variable resistance material layer includes performing an ion implantation process or oxidation process. The variable resistance material layer comprises a ferromagnetic material. The performing of the ion implantation process includes utilizing an impurity including Ga, Ge, As, In, P, C, Si, or B. The variable resistance material layer comprises a metal oxide including oxygen vacancies. The performing of the ion implantation process includes utilizing an oxygen-containing impurity. The ion implantation process is performed at a tilt of 30° to 90°. The performing of the oxidation process includes performing an anneal process or wet cleaning process. The method may further comprising, after the deactivating the part of the variable resistance material layer: forming a spacer layer along the entire structure including the top electrode; forming a second interlayer dielectric layer over the spacer layer; etching the second interlayer dielectric layer to expose the top electrode; and forming a conductive line to be in contact with the top electrode.

In another aspect, an electronic device is provided to include a semiconductor memory that includes a substrate; a first interlayer dielectric layer and a bottom electrode formed over the substrate, the bottom electrode having sidewalls surrounded by the first interlayer dielectric layer and a top surface lower than the first interlayer dielectric layer; a variable resistance material layer formed over the bottom electrode and having a top surface being flush with the first interlayer dielectric layer; and a top electrode formed over the variable resistance material layer.

Implementations of the above method may include one or more of the following.

The variable resistance material layer is extended to include a portion surrounding sidewalls of the top electrode and the extended portion of the variable resistance material layer has insulation characteristics. The variable resistance material includes ferromagnetic material or a metal oxide.

DETAILED DESCRIPTION

Figure 1A:
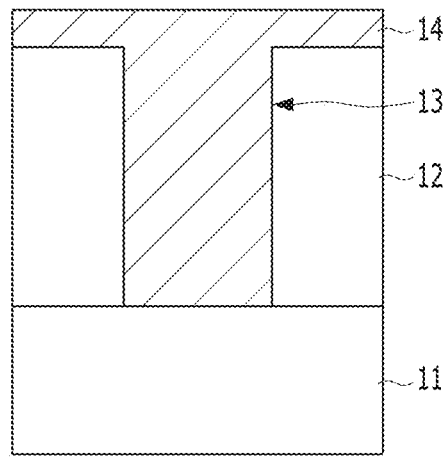
FIGS. 1A through 1H are cross-sectional views for describing a method for fabricating a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A through 1H are cross-sectional views for describing a method for fabricating a semiconductor device in accordance with an implementation.

As illustrated in FIG. 1A, a substrate 11 having a predetermined underlying structure (not illustrated) formed therein may be prepared.

The predetermined underlying structure may include various access elements for controlling the supply of voltage or current to a variable resistance element, for example, transistors or diodes.

Then, a first interlayer dielectric layer 12 may be formed over the substrate 11. The first interlayer dielectric layer 12 may include an insulating material. The first interlayer dielectric layer 12 may include, for example, oxide, nitride, or oxynitride. In some implementations, the first interlayer dielectric layer 12 may be formed to a sufficient thickness in consideration of the heights of a variable resistance element and a top electrode which are to be formed through subsequent processes.

The first interlayer dielectric layer 12 may be selectively etched to form a hole 13 which exposes a part of the substrate 11, and a first conductive material 14 may be buried in the hole 13.

The first conductive material 14 may include a material for forming a bottom electrode through a subsequent process, for example, a metal or metal nitride. The first conductive material 14 may include a stacked structure.

Figure 1B:
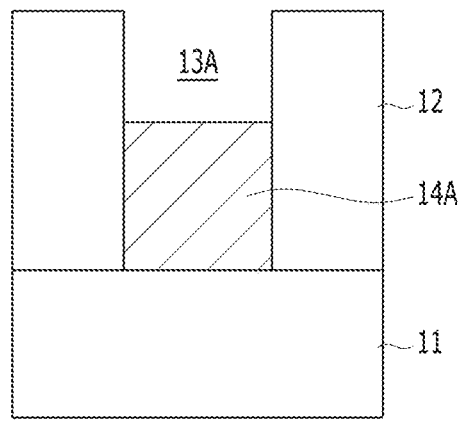

As illustrated in FIG. 1B, the first conductive material 14 (refer to FIG. 1A) may be etched to form a bottom electrode 14A. The bottom electrode 14A may be positioned under a variable resistance element, and serve as a path for supplying a voltage or current to the variable resistance element.

The etching process for the bottom electrode 14A may be performed to define an opening 13A having a predetermined depth in the first interlayer dielectric layer 12. At this time, the depth of the opening 13A may be adjusted in consideration of the thicknesses of a variable resistance layer and a top electrode which are to be formed through subsequent processes. The etching process may include an etch-back process or the like.

Figure 1C:
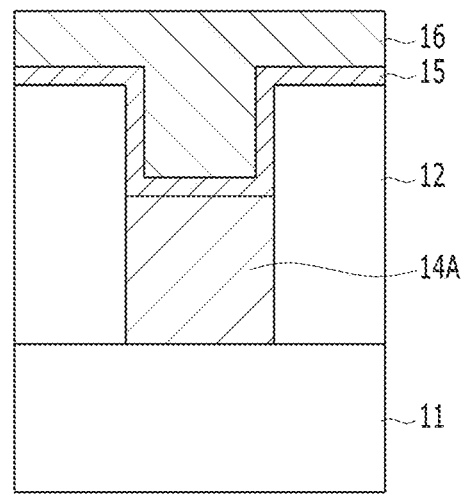

As illustrated in FIG. 1C, a variable resistance material layer 15 may be formed along the entire structure including the opening 13A.

The variable resistance material layer 15 may be formed by a deposition method which has excellent step coverage, for example, ALD (Atomic Layer Deposition). The variable resistance material layer 15 may include a material which has a characteristic of switching between different resistance states, according to a voltage or current applied across the variable resistance material layer 15. The variable resistance material layer 15 may include various materials used for RRAM, PRAM, FRAM, or MRAM and the like. For example, the various materials may include a transition metal oxide, a metal oxide such as a perovskite-based material, a phase change material such as a chalcogenide-based material, a ferrodielectric material, or a ferromagnetic material. The variable resistance material layer 15 may have a single-layer structure or a multilayer structure which includes a combination of two or more layers to exhibit a variable resistance characteristic.

For example, the variable resistance material layer 15 may have a MTJ (Magnetic Tunnel Junction) structure including a first magnetic layer (not illustrated), a second magnetic layer (not illustrated), and a tunnel barrier layer (not illustrated) interposed between the first and second magnetic layers.

The first and second magnetic layers may have a single-layer or multilayer structure including various ferromagnetic materials, such as Fe—Pt alloy, Fe—Pd ally, Co—Pd alloy, Co—Pt alloy, Fe—Ni—Pt alloy, Co—Fe—Pt alloy, or Co—

Ni—Pt alloy, and further include an impurity such as boron (B), but the present implementation is not limited thereto. As any one of the first and second magnetic layers has a changeable magnetization direction, the one magnetic layer may serve as a free layer or storage layer. As the other of the first and second magnetic layers has a pinned magnetization direction, the other magnetic layer may serve as a pinned layer or reference layer. The tunnel barrier layer can change the magnetization direction of the free layer through electron tunneling. The tunnel barrier layer may have a single-layer or multilayer structure including a dielectric material, for example, an oxide such as $Al_2O_3$, MgO, CaO, SrO, TiO, VO, or NbO, but the present implementation is not limited thereto.

When the magnetization directions of the first and second magnetic layers are parallel to each other, the variable resistance material layer 15 may be set in a low-resistance state, and store data '0', for example. On the other hand, when the magnetization directions of the first and second magnetic layers are anti-parallel to each other, the variable resistance material layer 15 may be set in a high-resistance state, and store data '1', for example. The variable resistance material layer 15 may further include various layers for securing the characteristic of the MTJ structure, in addition to the MTJ structure.

In some implementations, the variable resistance material layer 15 may include a metal oxide which contains oxygen vacancies and of which the resistance can be changed through the behavior of the oxygen vacancies. For example, the variable resistance material layer may include a stacked structure of an oxygen-rich first metal oxide layer (not illustrated) and an oxygen-deficient second metal oxide layer (not illustrated).

The first metal oxide layer may include a material which satisfies the stoichiometric ratio, such as $TiO_2$ or $Ta_2O_5$, and the second metal oxide layer may include a material which contains an insufficient amount of oxygen with respect to the stoichiometric ratio, such as $TiO_x$ (x<2) or $TaO_y$ (y<2.5).

The variable resistance material layer 15 may switch between a high-resistance state and a low-resistance state, depending on whether oxygen vacancies of the second metal oxide layer are supplied to the first metal oxide layer and whether a filament current path is formed in the first metal oxide layer by the oxygen vacancies. The variable resistance material layer 15 may further include various layers for securing the characteristics thereof.

Then, a second conductive material 16 may be formed over the variable resistance material layer 15 so as to fill the opening 13A. The second conductive material 16 may include a conductive material for forming a top electrode through a subsequent process, for example, a metal or metal nitride. The second conductive material 16 may include tungsten, for example.

Figure 1D:
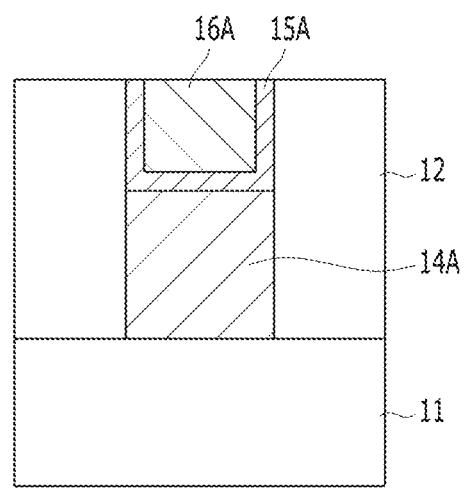

As illustrated in FIG. 1D, the variable resistance material layer 15 and the second conductive material 16 (refer to FIG. 1C) may be etched until the first interlayer dielectric layer 12 is exposed. The etching process may include a planarization process. The planarization process may include a CMP (Chemical Mechanical Polishing) process or an etch-back process, for example. The variable resistance material layer 15 and the second conductive material 16 may be etched in such a manner that the adjacent openings 13A are electrically isolated from each other.

Therefore, the variable resistance material layer 15A and the top electrode 16A may be sequentially formed over the bottom electrode 14A. The variable resistance material layer 15A may have a U-shaped structure including a horizontal part and a vertical part, and the top electrode 16A may have both sidewalls and a bottom surface which are surrounded by the variable resistance material layer 15A. The top electrode 16A may serve to electrically couple a variable resistance layer and a conductive line which are to be formed through a subsequent process.

Figure 1E:
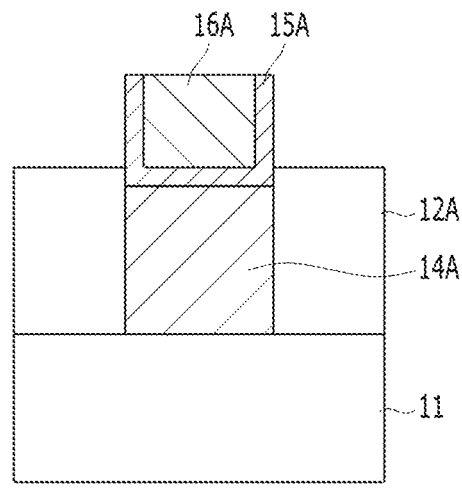

As illustrated in FIG. 1E, the first interlayer dielectric layer 12 (refer to FIG. 1D) may be etched to a predetermined height. The etched first interlayer dielectric layer will be represented by reference numeral 12A.

The first interlayer dielectric layer 12A may be etched to a level corresponding to the surface of the horizontal part of the variable resistance material layer 15A. Thus, the vertical part of the variable resistance material layer 15A may be exposed.

Figure 1F:
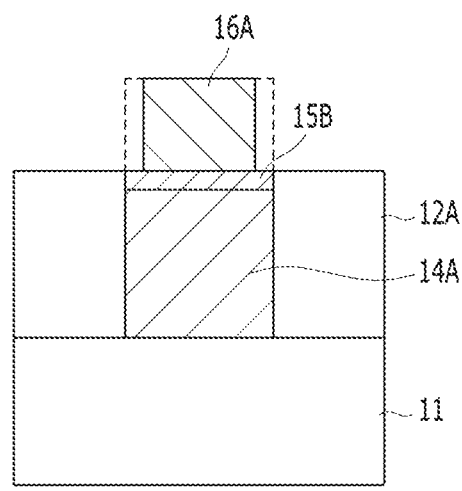

As illustrated in FIG. 1F, the vertical part of the exposed variable resistance material layer 15A (refer to FIG. 1E) may be removed. Thus, only the horizontal part 15B of the variable resistance material layer may remain, and the remaining variable resistance material layer 15B will be referred to as a variable resistance layer 15B. Therefore, a unit cell including the bottom electrode 14A, the variable resistance layer 15B, and the top electrode 16A may be formed.

The process for removing the vertical part of the variable resistance material layer 15A may include a dry etching process or wet cleaning process. For example, the dry etching process may include an IBE (Ion Beam Etching) process which is performed at a tilt of 30° to 90° in order to selectively remove only the vertical part of the variable resistance material layer 15A. The IBE process which is an unselective etching process using ion acceleration may be performed until the vertical part of the variable resistance material layer 15A, protruding from the first interlayer dielectric layer 12A, is completely removed. Thus, sidewalls of the horizontal part of the variable resistance material layer 15A may be protected from damage by the first interlayer dielectric layer 12A, and maintain the vertical profile.

The etching process may provide a structure in which the top electrode 16A protrudes from the first interlayer dielectric layer 12A.

Figure 1G:
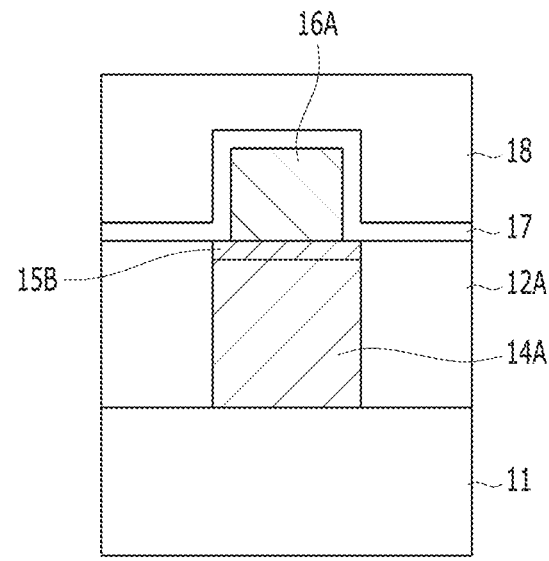

As illustrated in FIG. 1G, a spacer layer 17 may be formed along the entire structure including the top electrode 16A. The spacer layer 17 for preventing oxidation of the top electrode 16A and the variable resistance layer 15B may include an insulating material. For example, the spacer layer 17 may include a nitride material.

Then, a second interlayer dielectric layer 18 may be formed over the spacer layer 17. The second interlayer dielectric layer 18 may include oxide, nitride, or oxynitride. The second interlayer dielectric layer 18 may include the same material as the first interlayer dielectric layer 12A.

Figure 1H:
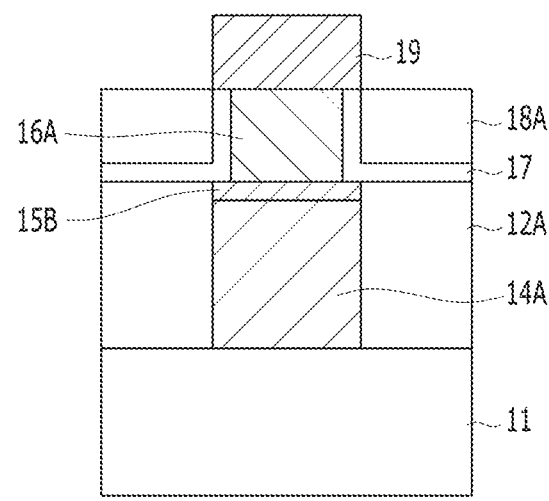

As illustrated in FIG. 1H, the spacer layer 17 and the second interlayer dielectric layer 18 (refer to FIG. 1G) may be etched until the top electrode 16A is exposed. The etching process may include a planarization process, for example.

Then, a conductive line 19 may be formed to be in contact with the top electrode 16A. The conductive line 19 may include a stacked structure of a barrier layer and a metal layer.

In the present implementation, a mask process for etching can be omitted through the self-align process for forming the variable resistance layer 15B and the top electrode 16A in the opening 13A over the bottom electrode 14A, which makes it possible to secure a process margin. Furthermore, as a misalign between the respective structures is prevented, characteristic deterioration caused by the exposure of the variable resistance layer 15B can be prevented. Furthermore, since a mask process for patterning the variable resistance layer 15B can also be omitted, the vertical profile of the variable resistance layer 15B can be secured. Furthermore, when the bottom electrode 14A is formed, an etch-back process may be performed to prevent dishing of the bottom electrode 14A which may occur during a CMP process.

FIGS. 2A through 2H are cross-sectional views for describing a method for fabricating a semiconductor device in accordance with another implementation.

Figure 2A:
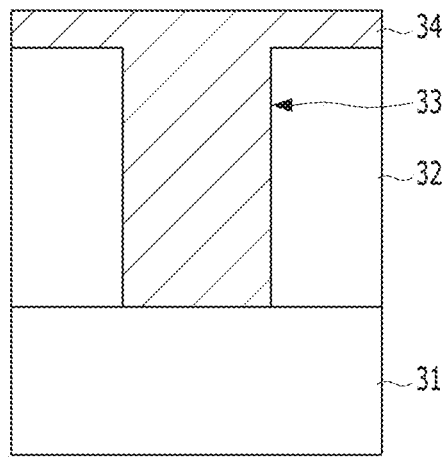
FIGS. 2A through 2H are cross-sectional views for describing a method for fabricating a semiconductor device in accordance with another implementation.

As illustrated in FIG. 2A, a substrate 31 having a predetermined underlying structure (not illustrated) formed therein may be prepared.

The predetermined underlying structure may include various access elements for controlling the supply of voltage or current to a variable resistance element, for example, transistors and diodes.

Then, a first interlayer dielectric layer 32 may be formed over the substrate 31. The first interlayer dielectric layer 32 may include an insulating material. The first interlayer dielectric layer 32 may include oxide, nitride, or oxynitride, for example. In some implementations, the first interlayer dielectric layer 32 may be formed to a sufficient thickness in consideration of the heights of a variable resistance layer and a top electrode which are to be formed through subsequent processes.

The first interlayer dielectric layer 32 may be selectively etched to form a hole 33 which exposes a part of the substrate 31, and a first conductive material 34 may be buried in the hole 33.

The first conductive material 34 may include a material for forming a bottom electrode through a subsequent process, for example, a metal or metal nitride. The first conductive material 34 may include a stacked structure.

Figure 2B:
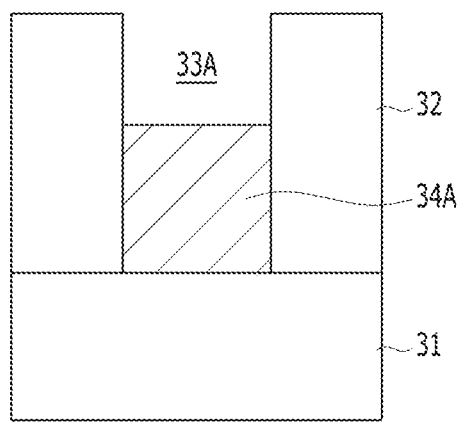

As illustrated in FIG. 2B, the first conductive material 34 (refer to FIG. 2A) may be etched to form a bottom electrode 34A. The bottom electrode 34A may be positioned under a variable resistance element, and serve as a path for supplying a voltage or current to the variable resistance element.

The etching process for the bottom electrode 34A may be performed to define an opening 33A having a predetermined depth in the first interlayer dielectric layer 32. At this time, the depth of the opening 33A may be adjusted in consideration of the heights of a variable resistance layer and a top electrode which are to be formed through subsequent processes. The etching process may include an etch-back process or the like.

Figure 2C:
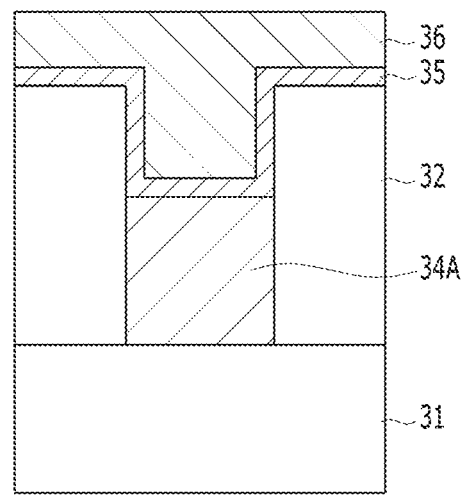

As illustrated in FIG. 2C, a variable resistance material layer 35 may be formed along the entire structure including the opening 33A.

The variable resistance material layer 35 may be formed by a deposition method which has excellent step coverage, for example, ALD (Atomic Layer Deposition). The variable resistance material layer 35 may include a material which has a characteristic of switching between different resistance states, according to a voltage or current applied across the variable resistance material layer 15. The variable resistance material layer 35 may include various materials used for RRAM, PRAM, FRAM, or MRAM and the like. For example, the various materials may include a transition metal oxide, a metal oxide such as a perovskite-based material, a phase change material such as a chalcogenide-based material, a ferrodielectric material, or a ferromagnetic material. The variable resistance material layer 35 may have a single-layer structure or a multilayer structure which includes a combination of two or more layers to exhibit a variable resistance characteristic.

For example, the variable resistance material layer 35 may have a MTJ structure including a first magnetic layer (not illustrated), a second magnetic layer (not illustrated), and a tunnel barrier layer (not illustrated) interposed between the first and second magnetic layers.

The first and second magnetic layers may have a single-layer or multilayer structure including various ferromagnetic materials, such as Fe—Pt alloy, Fe—Pd ally, Co—Pd alloy, Co—Pt alloy, Fe—Ni—Pt alloy, Co—Fe—Pt alloy, or Co—Ni—Pt alloy, and further include an impurity such as boron (B), but the present implementation is not limited thereto. As any one of the first and second magnetic layers has a changeable magnetization direction, the one magnetic layer may serve as a free layer or storage layer. As the other of the first and second magnetic layers has a pinned magnetization direction, the other magnetic layer may serve as a pinned layer or reference layer. The tunnel barrier layer can change the magnetization direction of the free layer through electron tunneling. The tunnel barrier layer may have a single-layer or multilayer structure including a dielectric material, for example, an oxide such as $Al_2O_3$, MgO, CaO, SrO, TiO, VO, or NbO, but the present implementation is not limited thereto.

When the magnetization directions of the first and second magnetic layers are parallel to each other, the variable resistance material layer 35 may be set in a low-resistance state, and store data '0', for example. On the other hand, when the magnetization directions of the first and second magnetic layers are anti-parallel to each other, the variable resistance material layer 35 may be set in a high-resistance state, and store data '1', for example. The variable resistance material layer 35 may further include various layers for securing the characteristic of the MTJ structure, in addition to the MTJ structure.

In some implementations, the variable resistance material layer 35 may include a metal oxide which contains oxygen vacancies and of which the resistance can be changed through the behavior of the oxygen vacancies. For example, the variable resistance material layer 35 may include a stacked structure of an oxygen-rich first metal oxide layer (not illustrated) and an oxygen-deficient second metal oxide layer (not illustrated).

The first metal oxide layer may include a material which satisfies the stoichiometric ratio, such as $TiO_2$ or $Ta_2O_5$, and the second metal oxide layer may include a material which contains an insufficient amount of oxygen with respect to the stoichiometric ratio, such as $TiO_x$ (x<2) or $TaO_y$ (y<2.5).

The variable resistance material layer 35 may switch between a high-resistance state and a low-resistance state, depending on whether oxygen vacancies of the second metal oxide layer are supplied to the first metal oxide layer and whether a filament current path is formed in the first metal oxide layer by the oxygen vacancies. The variable resistance material layer 35 may further include various layers for securing the characteristic thereof.

Then, a second conductive material 36 may be formed over the variable resistance material layer 35 so as to fill the opening 33A. The second conductive material 36 may include a conductive material for forming a top electrode through a subsequent process, for example, a metal or metal nitride. For example, the second conductive material 36 may include tungsten.

Figure 2D:
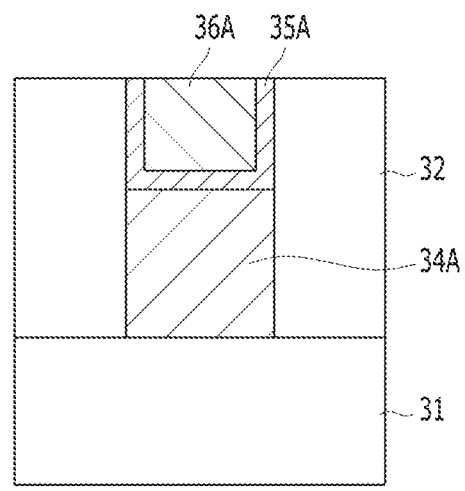

As illustrated in FIG. 2D, the variable resistance material layer 35 and the second conductive material 36 (refer to FIG. 2C) may be etched until the first interlayer dielectric layer 32 is exposed. The etching process may include a planarization process. The planarization process may include a CMP process or etch-back process, for example. The variable resistance material layer 35 and the second conductive material 36 may be etched in such a manner that the adjacent openings 33A are electrically isolated from each other.

Therefore, the variable resistance material layer 35A and the top electrode 36A may be sequentially formed over the bottom electrode 34A. The variable resistance material layer 35A may have a U-shaped structure including a horizontal part and a vertical part, and the top electrode 36A may have both sidewalls and a bottom surface which are surrounded by the variable resistance material layer 35A. The top electrode 36A may serve to electrically couple a variable resistance layer and a conductive line which are to be formed through a subsequent process.

Figure 2E:
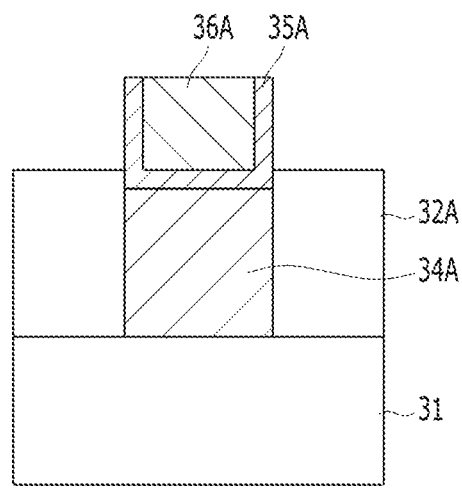

As illustrated in FIG. 2E, the first interlayer dielectric layer 32 (refer to FIG. 2D) may be etched to a predetermined height. The etched first interlayer dielectric layer will be represented by reference numeral 32A.

The first interlayer dielectric layer 32A may be etched to a level corresponding to the surface of the horizontal part of the variable resistance material layer 35A. Thus, the vertical part of the variable resistance material layer 35A may be exposed.

Figure 2F:
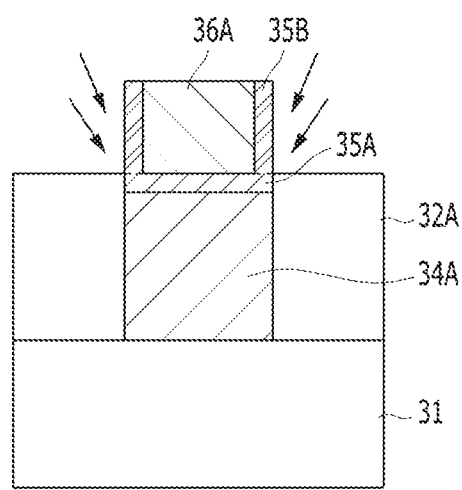

As illustrated in FIG. 2F, a deactivation process may be performed on the vertical part of the exposed variable resistance material layer 35A (refer to FIG. 2E). The deactivation process may indicate a process which deprives of the variable resistance characteristic of the variable resistance material layer 35A such that the variable resistance material layer 35A has an insulation property. The deactivation process may include an ion implantation process or oxidation process.

The ion implantation process may be performed at a tilt of 30° to 90° in order to selectively implant impurities into the vertical part of the variable resistance material layer 35A. For example, when the variable resistance material layer 35A includes an MTJ structure, any non-magnetic material including impurities which deprive of the magnetic property of magnetic layers, for example, Ga, Ge, As, In, P, C, Si or B may be doped into the vertical part of the variable resistance material layer 35A. For example, when the variable resistance material layer 35A includes a metal oxide, an oxygen-containing impurity may be doped into the metal oxide layer which does not satisfy the stoichiometric ratio. As the oxygen-containing impurity is doped to reduce and/or remove oxygen vacancies of the metal oxide layer, the stoichiometric ratio of the metal oxide layer can be satisfied to deprive of the variable resistance characteristic.

The oxidation process may include an anneal process or wet cleaning process.

As a result, the vertical part of the variable resistance material layer 35A may lose the variable resistance characteristic through the ion implantation process or oxidation process, but the horizontal part of the variable resistance material layer 35A may be protected by the top electrode 36A and the first interlayer dielectric layer 32A and maintain the variable resistance characteristic. Thus, only the horizontal part of the variable resistance material layer 35A may function as the variable resistance layer. Hereafter, the vertical part of the variable resistance material layer may be referred to as an inactive region 35B, and the horizontal part of the variable resistance material layer may be referred to as a variable resistance layer 35A.

Figure 2G:
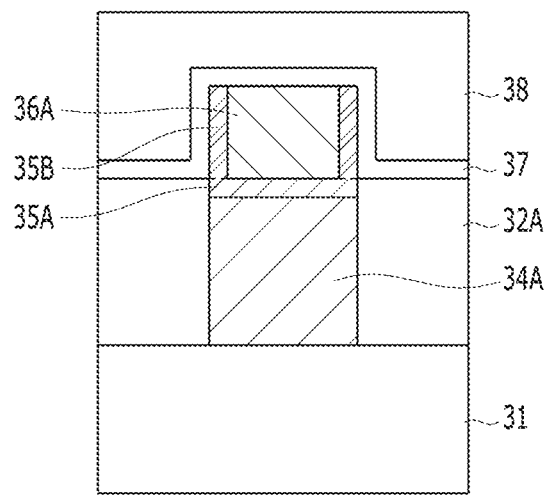

As illustrated in FIG. 2G, a spacer layer 37 may be formed along the entire structure including the inactive region 35B and the top electrode 36A. The spacer layer 37 for preventing oxidation of the top electrode 36A may include an insulating material. For example, the spacer layer 37 may include a nitride material.

Then, a second interlayer dielectric layer 38 may be formed over the spacer layer 37. The second interlayer dielectric layer 38 may include oxide, nitride, or oxynitride. The second interlayer dielectric layer 38 may include the same material as the first interlayer dielectric layer 32A.

Figure 2H:
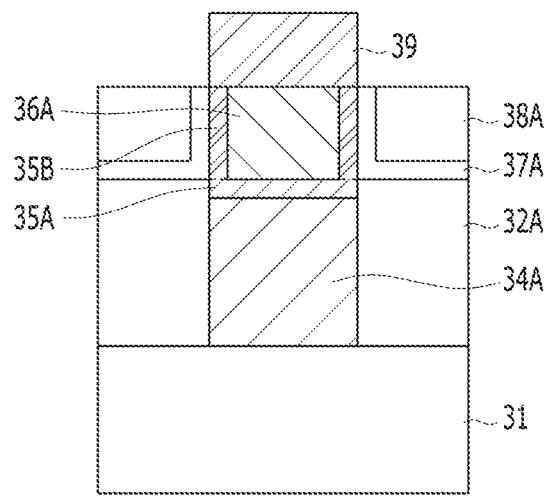

As illustrated in FIG. 2H, the spacer layer 37 and the second interlayer dielectric layer 38 (refer to FIG. 2G) may be etched until the top electrode 36A is exposed. The etching process may include a planarization process, for example.

Then, a conductive line 39 may be formed to be in contact with the top electrode 36A. The conductive line 39 may include a stacked structure of a barrier layer and a metal layer.

In the present implementation, a mask process may be omitted through the self-align process for forming the variable resistance layer 35A and the top electrode 36A in the opening 33A over the bottom electrode 34A, which makes it possible to secure a process margin. Furthermore, as a misalign between the respective structures is prevented, characteristic deterioration caused by the exposure of the variable resistance layer 35A can be prevented. Furthermore, since a mask process for patterning the variable resistance layer 35A can also be omitted, the vertical profile of the variable resistance layer 35A can be secured. Furthermore, when the bottom electrode 34A is formed, an etch-back process may be performed to prevent dishing of the bottom electrode 34A which may occur during a CMP process.

In accordance with the implementations, the method for fabricating an electronic device including a semiconductor memory may have a simple process and can improve the characteristic of the variable resistance element.

The above and other memory circuits or semiconductor devices based on the disclosed technology can be used in a range of devices or systems. FIGS. 3-7 provide some examples of devices or systems that can implement the memory circuits disclosed herein.

Figure 3:
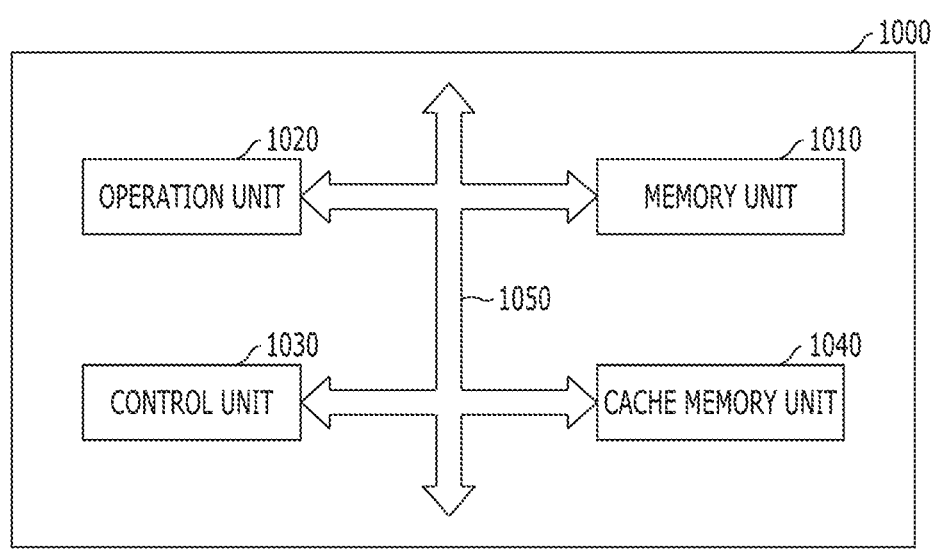
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
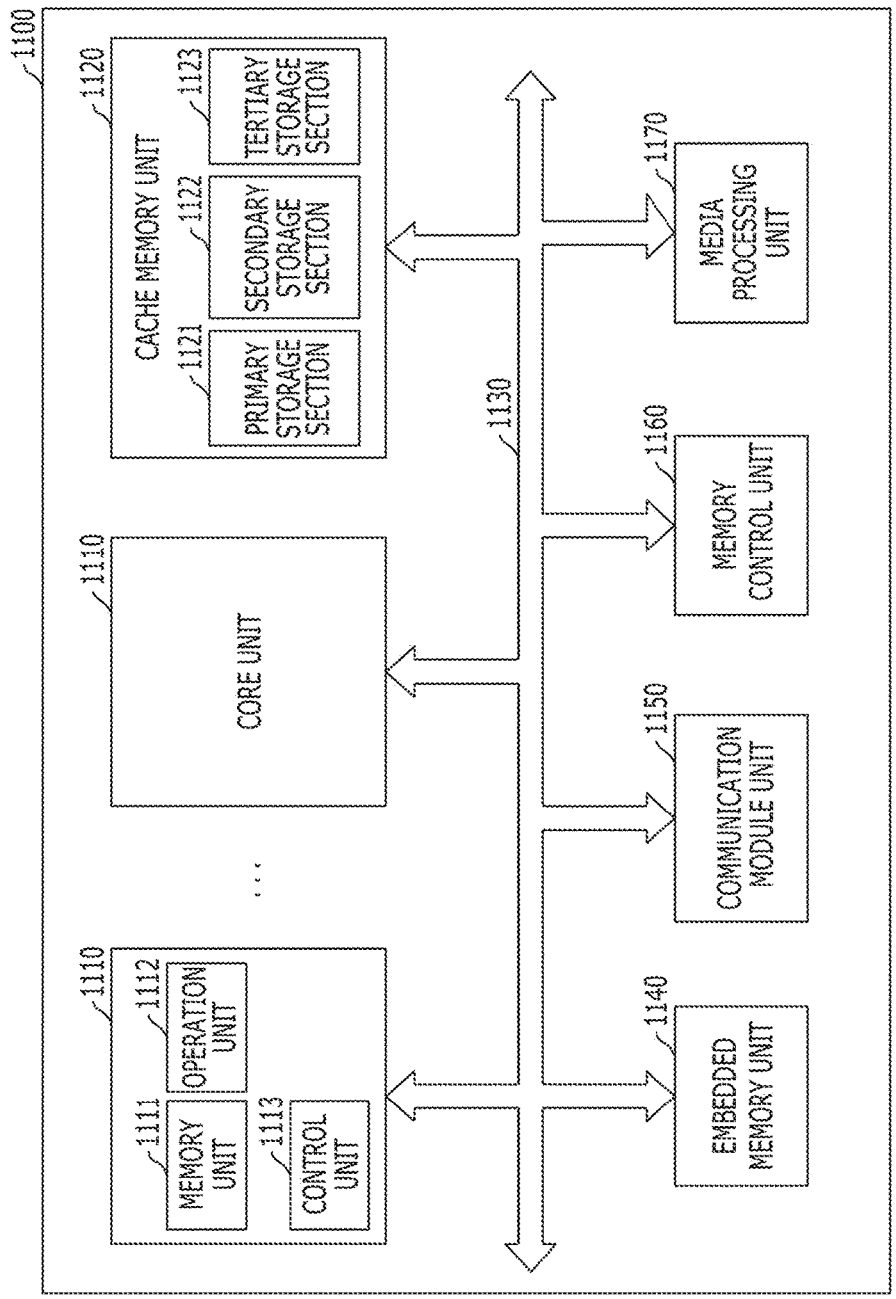
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
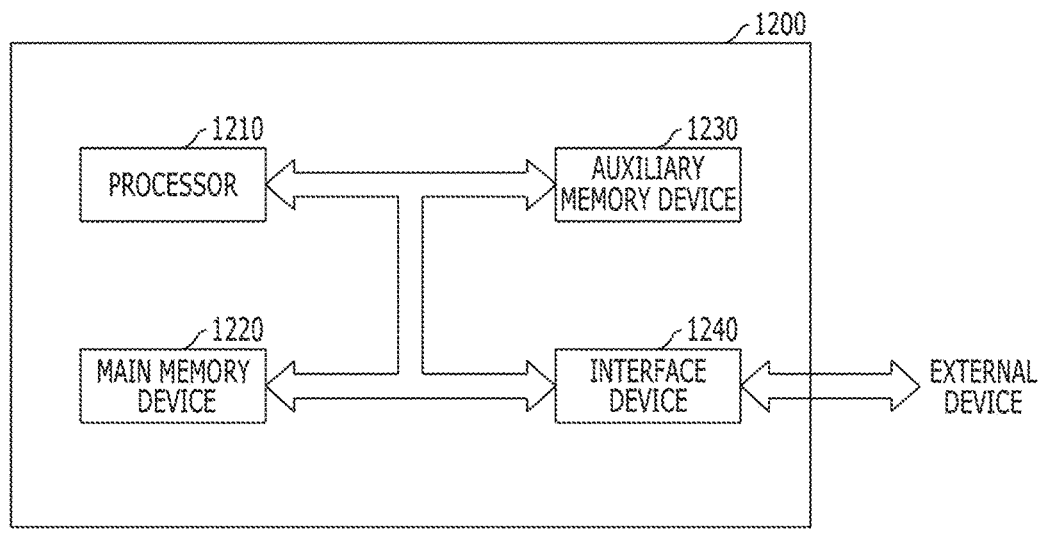
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
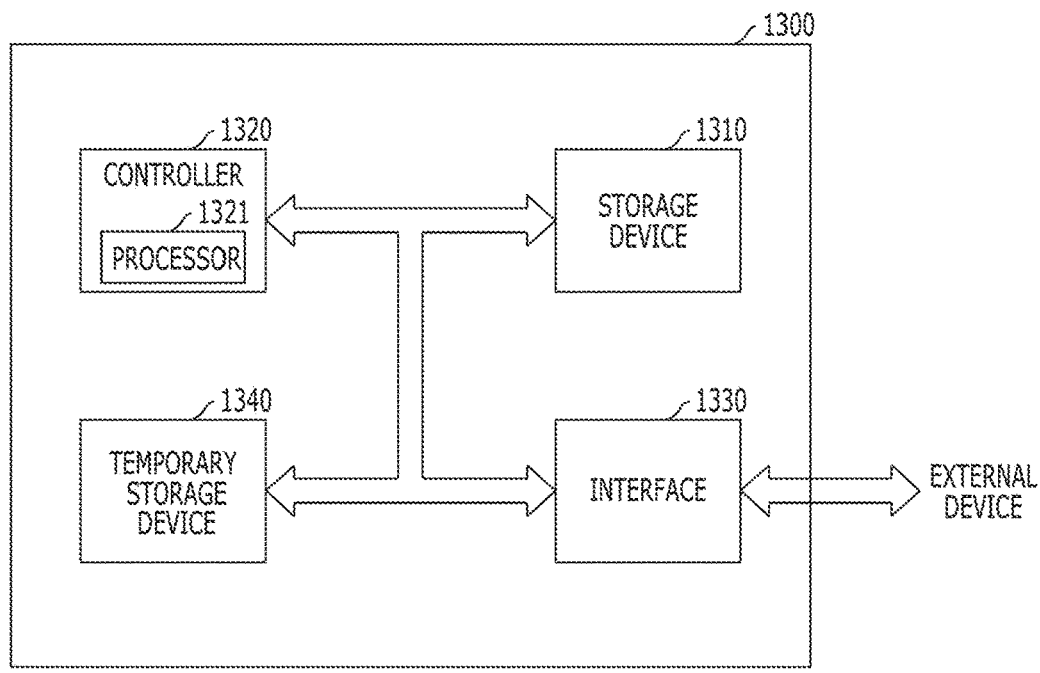
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 7:
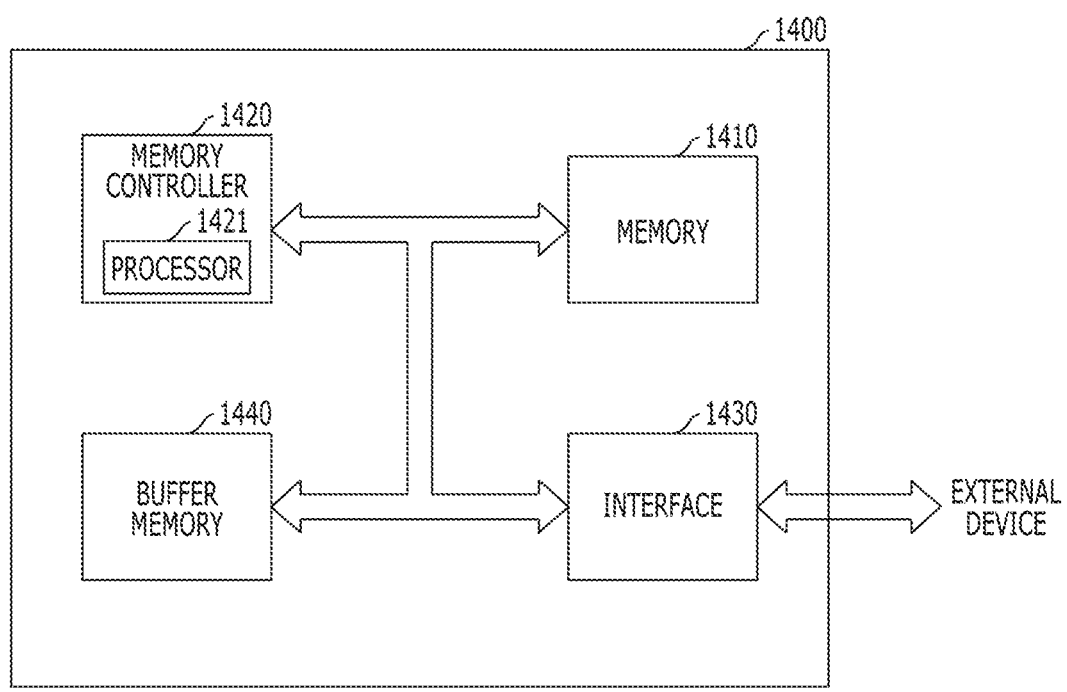
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an electronic device is formed in forming a first interlayer dielectric layer over a substrate to have an opening exposing the substrate; forming a bottom electrode in a portion of the opening to have an exposed top surface; forming a variable resistance material layer along sidewalls of the remaining portion of the opening and the exposed top surface of the bottom electrode; forming a top electrode over the variable resistance material layer so as to fill the opening; etching the first interlayer dielectric layer to a predetermined depth to expose a part of the variable resistance material layer surrounding sidewalls of the top electrode; and removing the part of the variable resistance material layer to form a unit cell. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, comprising:
    forming a first interlayer dielectric layer and a bottom electrode over a substrate, the first interlayer dielectric layer including an opening to expose the bottom electrode;
    forming a variable resistance material layer along sidewalls of the opening and the exposed bottom electrode, the variable resistance material layer having a horizontal part and a vertical part;
    forming a top electrode over the variable resistance material layer so as to fill the opening;
    partially etching the first interlayer dielectric layer such that the first interlayer dielectric layer has a top surface lower than that of a top surface of the vertical part of the variable resistance material layer to expose the vertical part of the variable resistance material layer; and
    deactivating the exposed vertical part of the variable resistance material layer the deactivated vertical part of the variable resistance material layer surrounding the top electrode.

2. The method of claim 1, wherein
    the etching of the first interlayer dielectric layer includes etching the first interlayer dielectric layer to a level corresponding to the surface of the horizontal part of the variable resistance material layer.

3. The method of claim 1, wherein the deactivating of the exposed vertical part of the variable resistance material layer includes performing an ion implantation process or oxidation process.

4. The method of claim 3, wherein the forming of the variable resistance material layer includes forming the variable resistance material layer to comprise a ferromagnetic material.

5. The method of claim 4, wherein the performing of the ion implantation process includes utilizing an impurity including Ga, Ge, As, In, P, C, Si, or B.

6. The method of claim 3, wherein the forming of the variable resistance material layer includes forming the variable resistance material layer to comprise a metal oxide including oxygen vacancies.

7. The method of claim 6, wherein the performing of the ion implantation process includes utilizing an oxygen-containing impurity.

8. The method of claim 3, wherein the ion implantation process is performed at a tilt of 30° to 90°.

9. The method of claim 3, wherein the performing of the oxidation process includes performing an anneal process or wet cleaning process.

10. The method of claim 1, further comprising, after the deactivating of the exposed vertical part of the variable resistance material layer:
    forming a spacer layer along the entire structure including the top electrode;
    forming a second interlayer dielectric layer over the spacer layer;
    etching the second interlayer dielectric layer to expose the top electrode; and
    forming a conductive line to be in contact with the top electrode.

11. A method for fabricating an electronic device including a semiconductor memory, comprising:
    forming a first interlayer dielectric layer over a substrate to have an opening passing through the first interlayer dielectric layer, the opening having a sidewall along the first interlayer dielectric layer;
    forming a first conductive material in the opening to have a first thickness along the sidewall of the opening, the first thickness being less than that of the sidewall of the opening;

forming a variable resistance material layer in the opening over the first conductive material to have a sidewall aligned with the sidewall of the opening, wherein the forming of the variable resistance material layer includes forming the variable resistance material layer to have an U shaped structure including a vertical part along the sidewall of the opening and a horizontal part; and forming a second conductive material in the opening;

etching the first interlayer dielectric layer to a predetermined depth to expose a sidewall of the vertical part of the variable resistance material layer; and deactivating the exposed sidewall of the vertical part of the variable resistance material layer.

12. The method of claim 11, wherein the forming of the variable resistance material layer includes forming the variable resistance material layer to include two magnetic layers and a tunnel barrier layer interposed between the two magnetic layers.

13. The method of claim 11, wherein the forming of the variable resistance material layer includes forming the variable resistance material layer to include a transition metal oxide, a metal oxide, or a phase change material.

14. The method of claim 11, wherein the deactivating of the exposed sidewall of the vertical part of the variable resistance material layer includes providing insulation property to the exposed sidewall of the variable resistance material layer.

15. The method of claim 11, wherein the deactivating of the exposed sidewall of the vertical part of the variable resistance material layer includes performing an ion implantation process utilizing an impurity including Ga, Ge, As, In, P, C, Si, or B, or performing an oxidation process.

16. The method of claim 11, further including, after the forming of the second conductive material:
forming a conductive line over the second conductive material to be in contact with the second conductive material.

17. A method for fabricating an electronic device including a semiconductor memory, comprising:
forming a first interlayer dielectric layer over a substrate, the first interlayer dielectric layer having an opening;
forming a bottom electrode in the opening to partially fill the opening;
forming a variable resistance material layer in the opening, the variable resistance material layer having a horizontal part on a top surface of the bottom electrode and a vertical part on a sidewall of the opening;
forming a top electrode on the variable resistance material layer to fill the opening;
recessing the first interlayer dielectric layer to expose a sidewall of the vertical part of the variable resistance material layer; and
deactivating the exposed sidewall of the vertical part of the variable resistance material layer.

18. The method of claim 17, further comprising:
forming a spacer layer on the top electrode, the deactivated sidewall of the vertical part of the variable resistance material layer, and the recessed first interlayer dielectric layer;
forming a second interlayer dielectric layer on the spacer layer; and
etching the second interlayer dielectric layer and the spacer layer to expose the top electrode; and
forming a conductive line on the top electrode.

19. The method of claim 17, wherein the deactivating of the exposed sidewall of the vertical part of the variable resistance material layer includes performing an ion implantation process utilizing an impurity including Ga, Ge, As, In, P, C, Si, B, or oxygen-containing impurity.

20. The method of claim 17, wherein the deactivating of the exposed sidewall of the vertical part of the variable resistance material layer includes performing an oxidation process including an anneal process, wet cleaning process, or an oxygen-containing impurity implantation process.

21. A method for fabricating an electronic device including a semiconductor memory, comprising:
forming a first interlayer dielectric layer and a bottom electrode over a substrate, the first interlayer dielectric layer including an opening to expose the bottom electrode;
forming a variable resistance material layer along sidewalls of the opening and the exposed bottom electrode;
forming a top electrode over the variable resistance material layer so as to fill the opening;
etching the first interlayer dielectric layer to a predetermined depth; and
deactivating a part of the variable resistance material layer surrounding the top electrode to form a unit cell, and
wherein the variable resistance material layer has a horizontal part and a vertical part, and
the etching of the first interlayer dielectric layer includes etching the first interlayer dielectric layer to a level corresponding to the surface of the horizontal part of the variable resistance material layer.

22. The method of claim 21, wherein the forming of the variable resistance material layer includes forming the variable resistance material layer to include two magnetic layers and a tunnel barrier layer interposed between the two magnetic layers.

23. The method of claim 21, wherein the deactivating of the part of the variable resistance material layer includes providing insulation property to the exposed variable resistance material layer.

24. The method of claim 21, wherein the deactivating of the part of the variable resistance material layer includes performing an ion implantation process utilizing an impurity including Ga, Ge, As, In, P, C, Si, or B, or performing an oxidation process.

* * * * *